(12) United States Patent
Jou et al.

(10) Patent No.: US 9,991,876 B2
(45) Date of Patent: Jun. 5, 2018

(54) MASTER-SLAVE FLIP-FLOP

(71) Applicant: National Chiao Tung University, Hsinchu (TW)

(72) Inventors: Shyh-Jye Jou, Hsinchu (TW); Chia-Hsiang Yang, Hsinchu (TW); Wei-Chang Liu, Hsinchu (TW); Chi-Wei Lo, Hsinchu (TW); Ching-Da Chan, Hsinchu (TW)

(73) Assignee: NATIONAL CHIAO TUNG UNIVERSITY, Hsinchu (TW)

( * ) Notice: Subject to any disclaimer, the term of this patent is extended or adjusted under 35 U.S.C. 154(b) by 48 days.

(21) Appl. No.: 15/385,349

(22) Filed: Dec. 20, 2016

(65) Prior Publication Data

US 2017/0104472 A1  Apr. 13, 2017

Related U.S. Application Data

(62) Division of application No. 14/618,595, filed on Feb. 10, 2015, now Pat. No. 9,608,603.

(30) Foreign Application Priority Data

Sep. 3, 2014  (TW) .............................. 103130449 A

(51) Int. Cl.
  *H03K 3/289*  (2006.01)
  *H03K 3/011*  (2006.01)
  *H03K 5/1534*  (2006.01)
  *H03K 3/037*  (2006.01)

(52) U.S. Cl.
  CPC ........... *H03K 3/011* (2013.01); *H03K 3/0372* (2013.01); *H03K 5/1534* (2013.01)

(58) Field of Classification Search
  None
  See application file for complete search history.

(56) References Cited

U.S. PATENT DOCUMENTS

| 7,120,214 B2* | 10/2006 | Takata .................. G06F 1/10 375/354 |
| 9,608,603 B2* | 3/2017 | Jou .................. H03K 3/0372 |
| 2003/0030472 A1* | 2/2003 | Takata .................. G06F 1/10 327/141 |

* cited by examiner

*Primary Examiner* — Long Nguyen
(74) *Attorney, Agent, or Firm* — Muncy, Geissler, Olds & Lowe, P.C.

(57) ABSTRACT

A master-slave flip-flop includes a master latch, a slave latch, a first logic gate and a signal transition detector. The first logic gate is receiving a reference clock and a first control clock, and outputting a first trigger signal to control one of the master latch and the slave latch, which are connected with a logic circuit, to switch to an opaque state or a transparent state, wherein the other one of the master latch and the slave latch is switched to an opaque state or a transparent state according to the reference clock. The above-mentioned master-slave flip-flop can correct sampling when a timing error occurs.

6 Claims, 2 Drawing Sheets

MASTER-SLAVE FLIP-FLOP

CROSS-REFERENCE TO RELATED APPLICATION

This is a divisional of U.S. patent application Ser. No. 14/618,595, filed Feb. 10, 2015, the contents of each of which is incorporated herein by reference in its entirety. This Divisional Application claims the benefit of the U.S. patent application Ser. No. 14/618,595.

BACKGROUND OF THE INVENTION

1. Field of the Invention

The present invention relates to a master-slave flip-flop, particularly to a master-slave flip-flop, which can control the sampling timing.

2. Description of the Prior Art

How to correctly sample signals is a critical problem for circuit design. However, many factors, such as PVT (Process-Voltage-Temperature) variation, low supply voltage, and overclocking, may cause timing errors and thus result in sampling errors. The conventional technology uses a signal transition detector to detect timing errors. While an error occurs, the value sampled at the corresponding timing is abandoned directly, and the signal is resampled in the next cycle. Alternatively, the time interval for sampling elongated whenever a timing error occurs. Thus, a cycle of time is wasted. The signal transition detector compares the output value of the logic circuit with the output value after a delay to determine whether an error occurs. However, the output value after a delay, which may be a correct result of the shortest path of the logic circuit, is likely to be misjudged as a result of a timing error. Hence, the time of a shortest path in a logic circuit must be strictly limited, which lead to expansion of logic circuit area, lest signal competition lead to misjudgment of time errors.

Therefore, it is highly desirable to develop a sampling circuit with timing error tolerance.

SUMMARY OF THE INVENTION

The present invention provides a master-slave flip-flop. While a timing error occurs, the present invention can lock the signal input from an upstream side of a logic circuit and delay the sampling timing. Thereby, the present invention can tolerate timing errors and sample signals correctly.

One embodiment of the present invention proposes a master-slave flip-flop, which comprises a master latch, a slave latch, a first signal transition detector, and a first logic gate. The master latch is disposed on a downstream side of a first logic circuit, connected with a first logic circuit and receiving an input signal from the first logic circuit. The slave latch is disposed on a downstream side of the master latch. The first signal transition detector is disposed on a downstream side of the first logic circuit, electrically connected with the first logic circuit, detecting whether the input signal outputted by the first logic circuit is incorrect, and outputting a first control clock corresponding to the input signal. The first logic gate is connected with the master latch and the first signal transition detector, receiving a reference clock and a first control clock, and outputting a first trigger signal to control the master latch to switch to an opaque state or a transparent state, wherein the slave latch is switched to an opaque state or a transparent state according to the reference clock.

Another embodiment of the present invention proposes a master-slave flip-flop, which comprises a master latch, a slave latch, a signal transition detector, and a first logic gate. The slave latch is disposed on a downstream side of the master latch, disposed on a upstream side of a logic circuit, connected with the logic circuit, and outputting a first output signal to the logic circuit. The signal transition detector is disposed on a downstream side of the logic circuit, electrically connected with the logic circuit, detecting whether a second output signal outputted by the logic circuit is incorrect, and outputting a first control clock corresponding to the second output signal. The first logic gate is connected with the slave latch, receiving a reference clock and said first control clock, and outputting a first trigger signal to control the slave latch to switch to an opaque state or a transparent state, wherein the master latch is switched to an opaque state or a transparent state according to the reference clock.

Below, the embodiments are described in detail in cooperation with the attached drawings to make easily understood the objectives, technical contents, characteristics and accomplishments of the present invention.

DESCRIPTION OF THE PREFERRED EMBODIMENT

Figure 1:
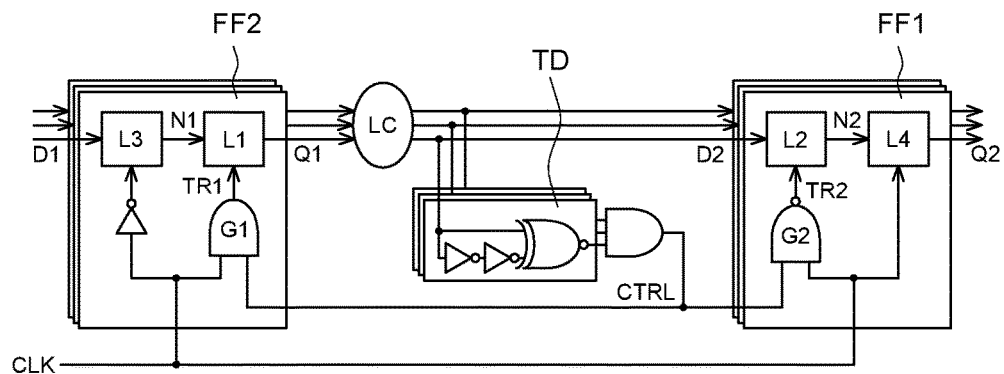
FIG. 1 schematically shows a sampling circuit according to one embodiment of the present invention.

According to one embodiment of the present invention, a sampling circuit comprises a first latch L1, a second latch L2, and a signal transition detector TD, as shown in FIG. 1. The signal transition detector TD is electrically connected with a logic circuit LC. For example, the signal transition detector TD compares the output of the logic circuit LC with the output after a delay to determine whether timing is in error and outputs a corresponding control clock CTRL. The first latch L1 is disposed on an upstream side of the logic circuit LC, receiving a signal N1 (a first input signal) and outputting a signal Q1 (a first output signal) to the logic circuit LC. The first latch L1 switches to an opaque state or a transparent state according to a first trigger signal TR1 generated by a reference clock CLK and the control clock CTRL outputted by the signal transition detector TD. In one embodiment, an AND gate G1 may be disposed and its two input terminals respectively receive the reference clock CLK and the control clock CTRL; and the output terminal of the AND gate G1 outputs the first trigger signal TR1 to the first latch L1 according to the voltage levels of the reference clock CLK and the control clock CTRL.

The second latch L2 is disposed on a downstream side of the logic circuit LC, receiving a signal D2 (a second input signal) from the logic circuit LC and outputting a signal N2 (a second output signal). The second latch L2 switches to an opaque state or a transparent state according to a second trigger signal TR2 generated by the reference clock CLK and the control clock CTRL. It should be noted that the state of the first latch L1 is opposite to the state of the second latch L2. For example, while the second latch L2 is in the transparent state, the first latch L1 is in the opaque state; while the second latch L2 is in the opaque state, the first latch L1 is in the transparent state. In one embodiment, a NAND gate G2 may be disposed and its two input terminals respectively receive the reference clock CLK and the control clock CTRL; the output terminal of the NAND gate G2 outputs the second trigger signal TR2 to the second latch L2 according to the voltage levels of the reference clock CLK and the control clock CTRL in anti-phase.

The current EDA (Electronic Design Automation) tool cannot analyze latching timing. Thus, in one embodiment, the sampling circuit of the present invention further comprises a third latch L3 disposed on an upstream side of the first latch L1. The third latch L3 cooperates with the first latch L1 to form a master-slave flip-flop FF2, wherein the third latch L3 functions as a master latch and the first latch L1 functions as a slave latch. In the embodiment shown in FIG. 1, the third latch L3 switches to an opaque state or a transparent state according to an anti-phase voltage level of the reference clock CLK. In general, the master latch and the slave latch switch to opposite states at the same time in a master-slave flip-flop. However, it should be noted in the master-slave flip-flop FF2 shown in FIG. 1: the time point at which the first latch L1 switches to a state opposite to the state of the third latch L3 may be later than the time point at which the third latch L3 switches its state. The operation of the first latch L1 will be described in detail thereinafter.

Similarly, in one embodiment, the sampling circuit of the present invention further comprises a fourth latch L4 disposed on a downstream side of the second latch L2. The fourth latch L4 cooperates with the second latch L2 to form a master-slave flip-flop FF1, wherein the second latch L2 functions as a master latch and the fourth latch L4 functions as a slave latch. In the embodiment shown in FIG. 1, the fourth latch L4 switches to an opaque state or a transparent state according to the reference clock CLK. Similarly, the time point at which the second latch L2 switches to a state opposite to the state of the fourth latch L4 may be later than the time point at which the fourth latch L4 switches its state. The operation of the second latch L2 will be described in detail thereinafter. Since the first latch L1 and the second latch L2 respectively cooperate with the third latch L3 and the fourth latch L4 to form the master-slave flip-flops FF2 and FF1, the current EDA tool can undertake timing analyses to assist in circuit design.

Figure 2:
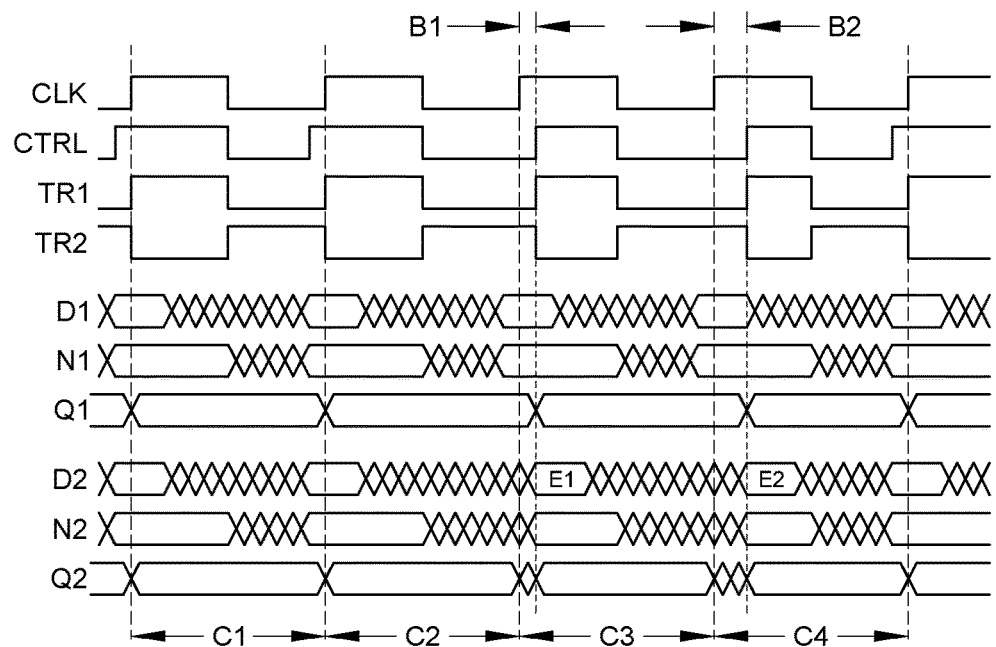
FIG. 2 is a timing diagram showing the operation of a sampling circuit according to one embodiment of the present invention.

FIG. 1 and FIG. 2 show the operation of the sampling circuit of the present invention. Please refer to the timing diagram shown in FIG. 2. It supposes that the high voltage level of the reference clock CLK is a sampling voltage level. It supposes that the high voltage levels of the first trigger signal TR1 and the second trigger signal TR2 are for transparent voltage levels, which may respectively trigger the first latch L1 and the second latch L2 to switch to transparent states, and it supposes that the low voltage levels of the first trigger signal TR1 and the second trigger signal TR2 are for opaque voltage levels, which may respectively trigger the first latch L1 and the second latch L2 to switch to opaque states. It should be understood that the timing diagram shown in FIG. 2 is only used to explain the present invention but not to limit the scope of the present invention; the persons skilled in the art should be able to design appropriate sampling voltage levels or latching voltage levels according to practical requirement without departing from the scope of the present invention. Besides, in the embodiment shown in FIG. 2, it is supposed that the signal D1, which is inputted into the master-slave flip-flop FF2, does not have timing errors.

As shown in FIG. 2, during the first cycle C1, the input terminals of the master-slave flip-flops FF2 and FF1 do not have timing errors. Therefore, stable signals D1 and D2 are inputted into the master-slave flip-flops FF2 and FF1 before the rising edge of the reference clock CLK. With the stable signal outputted by the logic circuit (i.e. the signal D2 inputted into the master-slave flip-flop FF1), the control clock CTRL switches to a high voltage level before the rising edge of the reference clock CLK. Meanwhile, the anti-phase signal of the reference clock CLK triggers the third latch L3 to switch to an opaque state and to output a signal N1, which is locked at the signal D1 occurring at the rising edge of the reference clock CLK. The first trigger signal TR1 generated by the reference clock CLK and the control clock CTRL triggers the first latch L1 to switch to a transparent state. Thus, the signal Q1 outputted by the first latch L1 varies with the signal N1 outputted by the third latch L3. However, the third latch L3 is in an opaque state, and the signal N1 does not change. Thus, the signal Q1 outputted by the first latch L1 does not change either. At the time point of the falling edge of the reference clock CLK, the anti-phase signal of the reference clock CLK triggers the third latch L3 to switch to a transparent state, and the signal N1 outputted by the third latch L3 varies with the signal D1. Meanwhile, the first trigger signal TR1 switches to a low voltage level and triggers the first latch L1 to switch to an opaque state. Thus, the signal Q1 outputted by the first latch L1 is locked at the signal N1 outputted by the third latch L3 occurring at the falling edge of the reference clock CLK.

Similarly, while the reference clock CLK is in a high voltage level, the second trigger signal TR2 is in a low voltage level. Meanwhile, the second latch L2 switches to an opaque state to lock the sampling result of the signal D2, i.e. the signal N2. The fourth latch L4 is in a transparent state, and the signal Q2 outputted by the fourth latch L4 varies with the signal N2. On the contrary, while the reference clock CLK switches to a low voltage level, the second latch L2 switches to a transparent state, and the signal N2 varies with the signal D2. The fourth latch L4 switches to an opaque state, and the signal Q2 outputted by the fourth latch L4 is locked at the signal N2 occurring at the falling edge of the reference clock CLK. Then, the process proceeds to the second cycle C2 and repeats the abovementioned steps.

While the process proceeds from the second cycle C2 to the third cycle C3, the logic circuit LC is unable to output a stable signal D2 before the arrival of the rising edge of the reference clock CLK. Thus, the control clock CTRL is still in a low voltage level occurring at the rising edge of the reference clock CLK. At this time, the second trigger signal TR2 is still in a high voltage level, and thus the second latch L2 is in a transparent state. In other words, the second latch L2 does not lock the sampling result and hence the signal passes through the second latch L2. The first trigger signal TR1 is in a low voltage level, and the first latch L1 is in an opaque state. In other words, a new signal Q1 will not be inputted into the logic circuit LC before the logic circuit outputs a stable signal D2. The present invention can prevent the correct shortest-path result of the logic circuit LC from misconducting the signal transition detector TD to judge that a timing error occurs. The control clock CTRL would not switch to a high voltage level until the logic circuit LC outputs a stable signal D2 (as indicated by E1 in FIG. 2). Then, the second trigger signal TR2 switches to a low voltage level; the second latch L2 switches to an opaque state to lock the sampling result of the stable signal D2. At the same time, the first trigger signal TR1 switches to a high voltage level; the first latch L1 is in a transparent state. Thus, the signal Q1 for the next cycle can be inputted into the logic circuit LC for succeeding operations.

While the process proceeds from the third cycle C3 to the fourth cycle C4, the logic circuit LC is still unable to output a stable signal D2 before the arrival of the rising edge of the reference clock CLK. The control clock CTRL would not switch to a high voltage level until the logic circuit LC outputs a stable signal D2 (as indicated by E2 in FIG. 2). Then, the second trigger signal TR2 switches to a low voltage level; the second latch L2 switches to an opaque state to lock the sampling result of the stable signal D2. The operation of the first latch L1 is the same as in the third cycle C3 and will not be explained again herein.

In the abovementioned circuit, if a timing error does not occur, the control clock CTRL would switch to a high voltage level before the arrival of the rising edge of the reference clock CLK. At the same time, the states of the first latch L1 and the second latch L2 vary with the voltage level of the reference clock CLK. While a timing error occurs, the control clock CTRL does not switch to a high voltage level until the rising edge of the reference clock CLK has passed. It means that a portion of sampling time of the next cycle, such as the borrowed time B1 and B2 shown in FIG. 2, is borrowed to increase the processing time of the logic circuit LC. In other words, the sampling activity is prolonged to increase the processing time of the logic circuit LC. It is learned from FIG. 2 that the borrowed time is accumulated if timing errors occur in successive cycles. It is easy to appreciate that the time interval borrowed in each cycle should be shorter than the time interval of the sampling voltage level of the reference clock CLK.

In the embodiment shown in FIG. 1, while a timing error occurs in the logic circuit LC, the second latch L2 may function as delaying the time point of sampling, and the first latch L1 may function as delaying the time point of outputting a new signal Q1 to the logic circuit LC.

Figure 3:
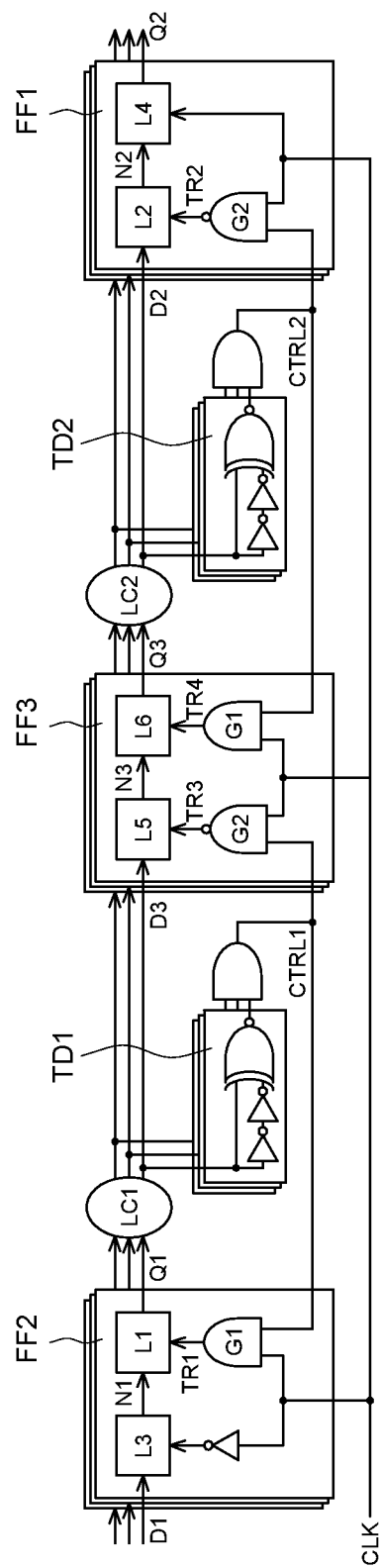
FIG. 3 schematically shows a sampling circuit according to another embodiment of the present invention.

In another embodiment, the second latch L2 and the first latch L1 cooperate to form a master-slave flip-flop between two logic circuits, wherein the second latch L2 functions as a master latch and the first latch L1 functions a slave latch. It is understood that the symbols L1 and L2 herein are only used for distinguishable illustration but not confined to those latches with same symbols in FIG. 1 and FIG. 3. Please further refer to FIG. 3 for an example in this embodiment. A master-slave flip-flop FF2 is disposed in the input terminal of two pipeline-stage logic circuits LC1 and LC2; a master-slave flip-flop FF1 is disposed in the output terminal of two pipeline-stage logic circuits LC1 and LC2; and a master-slave flip-flop FF3 is disposed between the logic circuit LC1 and the logic circuit LC2. It supposes that the signal D1 inputted into the master-salve flip-flop FF2 does not have timing errors. Thus, the third latch L3 of the master-slave flip-flop FF2 is directly triggered by the anti-phase signal of the reference clock CLK and switched to a corresponding state. It supposes that the next-stage logic circuit of the master-slave flip-flop FF1 does not have timing errors. Thus, the fourth latch L4 of the master-slave flip-flop FF1 can be directly triggered by the reference clock CLK and switched to a corresponding state. The principles and operations of the master-slave flip-flops FF2 and FF1 are the same as the master-slave flip-flops FF2 and FF1 shown in FIG. 1 and will not be explained again herein.

Refer to FIG. 3 again. The fifth latch L5 of the master-slave flip-flop FF3 is similar to the second latch L2 of the master-slave flip-flop FF1 and also functions as a master latch. In other words, while the logic circuit LC1 has a timing error, the signal transition detector TD1 detects the signal D3 outputted by the logic circuit LC1 and outputs a corresponding control clock CTRL1. At this time, the trigger signal TR3 varies with the control clock CTRL1 and delays the time point at which the fifth latch L5 switches to an opaque state (the sampling time point) to lock the signal N3. The sixth latch L6 of the master-slave flip-flop FF3 is like the first latch L1 of the master-slave flip-flop FF2 and also functions as a slave latch. In other words, while the logic circuit LC2 has a timing error, the signal transition detector TD2 detects the signal D2 outputted by the logic circuit LC2 and outputs a corresponding control clock CTRL2. At this time, the trigger signal TR4 varies with the control clock CTRL2 and delays the time point at which the sixth latch L6 switches to a transparent state so that the time point of outputting a signal Q3 for the next cycle to the logic circuit LC2 is delayed.

Further, it will be understood that, although the terms first, second etc., may be used herein to describe various elements should not be limited by these terms. These terms are only used to distinguish one element from another. For examples, "a first logic circuit" refers to a logic circuit which is disposed on an upstream side of a master-slave flip-flop, while "a second logic circuit" refers to a logic circuit which is disposed on a downstream side of a master-slave flip-flop. Similarly, "a first signal transition detector" refers to a signal transition detector which is connected to the first logic circuit and disposed on the upstream side of the master-slave flip-flop, while "a second signal transition detector" refers to a signal transition detector which is connected to the second logic circuit and disposed on the downstream side of the master-slave flip-flop.

It is easy to appreciate that the first latch L1 of the master-slave flip-flop FF2, the logic gate (the AND gate G1) connected with the first latch L1, the signal transition detector TD1, the fifth latch L5 of the master-slave flip-flop FF3 and the logic gate (the NAND gate G2) connected with the fifth latch L5 cooperate to form a sampling circuit of the present invention; the sixth latch L6 of the master-slave flip-flop FF3, the logic gate (the AND gate G1) connected with the sixth latch L6, the signal transition detector TD2, the second latch L2 of the master-slave flip-flop FF1 and the logic gate (the NAND gate G2) connected with the second latch L2 cooperate to form another sampling circuit of the present invention. Therefore, according to different circuit designs, different master-slave flip-flops FF1, FF2 and FF3 are selectively cascaded with multiple logic circuits LC1 and LC2 to form a pipeline-stage logic circuit.

In summary, the sampling circuit and the master-slave flip-flop of the present invention delay the sampling time point while a timing error occurs, whereby abandoning the sampling value and wasting one cycle of time are avoided. Further, the present invention locks the input signal from an upstream side of a logic circuit to prevent the correct shortest-path result of the logic circuit from misconducting the judgment of timing errors. Therefore, the sampling circuit and the master-slave flip-flop can tolerate a broader range of timing errors and sample signals correctly.

The technical thought and characteristics of the present invention have been demonstrated with the embodiments described above to enable the persons skilled in the art to understand, make, and use the present invention. However, these embodiments are only to exemplify the present invention but not to limit the scope of the present invention. Any equivalent modification or variation according to the spirit of the present invention is to be also included within the scope of the present invention.

What is claimed is:

1. A master-slave flip-flop comprising
a master latch disposed on a downstream side of a first logic circuit, connected with said first logic circuit and receiving an input signal from said first logic circuit;
a slave latch disposed on a downstream side of said master latch;
a first signal transition detector disposed on a downstream side of said first logic circuit, electrically connected with said first logic circuit, detecting whether said input signal outputted by said first logic circuit is incorrect, and outputting a first control clock corresponding to said input signal; and
a first logic gate connected with said master latch and said first signal transition detector, receiving a reference clock and the first control clock, and outputting a first trigger signal to control said master latch to switch to an opaque state or a transparent state, wherein said slave latch is switched to an opaque state or a transparent state according to said reference clock.

2. The master-slave flip-flop according to claim 1, wherein said first logic gate is a NAND gate connected with said master latch.

3. The master-slave flip-flop according to claim 1 further comprising
a second signal transition detector disposed on a downstream side of a second logic circuit, electrically connected with said second logic circuit, detecting whether an output signal outputted by said second logic circuit is incorrect, and outputting a second control clock corresponding to said output signal; and
a second logic gate connected with said slave latch and said second signal transition detector, receiving said reference clock and said second control clock, and outputting a second trigger signal to control said slave latch to switch to an opaque state or a transparent state.

4. The master-slave flip-flop according to claim 3, wherein said first logic gate is a NAND gate connected with said master latch, and wherein said second logic gate is an AND gate connected with said slave latch.

5. A master-slave flip-flop comprising
a master latch;
a slave latch disposed on a downstream side of said master latch, disposed on a upstream side of a logic circuit, connected with said logic circuit, and outputting a first output signal to said logic circuit;
a signal transition detector disposed on a downstream side of said logic circuit, electrically connected with said logic circuit, detecting whether a second output signal outputted by said logic circuit is incorrect, and outputting a first control clock corresponding to said second output signal; and
a first logic gate connected with said slave latch, receiving a reference clock and said first control clock, and outputting a first trigger signal to control said slave latch to switch to an opaque state or a transparent state, wherein said master latch is switched to an opaque state or a transparent state according to said reference clock.

6. The master-slave flip-flop according to claim 5, wherein said first logic gate is an AND gate connected with said slave latch.

* * * * *